United States Patent [19]

Leikus

[11] Patent Number: 4,672,308
[45] Date of Patent: Jun. 9, 1987

[54] ENHANCED FREQUENCY DETERMINATION FOR SPECTRUM ANALYZERS OR THE LIKE

[75] Inventor: Vincent C. Leikus, Fairfield, Conn.

[73] Assignee: Rohde & Schwarz - Polarad, Inc.

[21] Appl. No.: 805,349

[22] Filed: Dec. 5, 1985

[51] Int. Cl.$^4$ .............................. G01R 23/16
[52] U.S. Cl. ..................... 324/77 B; 324/78 Z; 324/79 R
[58] Field of Search ............... 324/77 R, 77 B, 77 C, 324/77 D, 78 R, 78 Z, 79 R, 79 D; 364/484, 485, 571; 328/140, 141

[56] References Cited

U.S. PATENT DOCUMENTS

| | | | |
|---|---|---|---|
| 4,249,257 | 2/1981 | Campbell | 324/78 Z |
| 4,258,436 | 3/1981 | Campbell | 324/78 Z |
| 4,415,854 | 11/1983 | Remy | 324/79 R |

Primary Examiner—Michael J. Tokar
Attorney, Agent, or Firm—Darby & Darby

[57] ABSTRACT

An arrangement is provided for enhancing the accuracy of frequency determination in a spectrum analyzer or the like having a local oscillator heterodyned with and locked to a frequency comb, by providing a determination of whether the local oscillator frequency is above or below the comb frequency to which it is locked, thereby avoiding ambiguity in the determination of the local oscillator frequency.

12 Claims, 8 Drawing Figures

LO FREQUENCY

ENHANCED FREQUENCY DETERMINATION FOR SPECTRUM ANALYZERS OR THE LIKE

The present invention concerns improvements enhancing the accuracy of frequency determination, as in spectrum analyzers or the like.

BACKGROUND OF THE ART

In spectrum analyzers, incoming signals of unknown frequency are received and processed to determine their frequency, among other features. This is generally done by causing a receiver circuit to sweep or scan a frequency spectrum, across a band that includes the unknown signal, and determining the frequency of the unknown signal by display or indication on a suitable display such as a cathode ray tube calibrated in frequency.

One way which has been used is to sweep a local oscillator frequency over a desired range and to heterodyne it with the input signal. By using a fixed intermediate frequency, the local oscillator frequency value becomes an indication of the input frequency value, differing from it by the value of the intermediate frequency. The sweeping is terminated when an input signal is received which produces the fixed intermediate frequency. The frequency of the local oscillator is then determined by comparing it with a "comb" of frequencies, derived from a variable control oscillator (VCO) producing an output rich in harmonics, the set of harmonics being spaced at discrete intervals equal to the fundamental frequency $F_{VC}$ of the variable control oscillator. The VCO is varied in frequency until a harmonic (e.g. the N-th harmonic) of $F_{VC}$ differs from the local oscillator frequency by a reference frequency $F_R$. Then the harmonic order N is determined, and the local oscillator frequency becomes determined as $N \times F_{VC} \pm F_R$. The input frequency $F_{IN}$ then is known as displaced from the local oscillator frequency by the fixed intermediate frequency $F_{IF}$.

In such an arrangement, an ambiguity can arise, in that the local oscillator frequency may heterodyne with a comb frequency by being either above one comb frequency (which may be a harmonic N of the fundamental $F_{VC}$ of the VCO), or below the adjacent harmonic (e.g. N+1) of the comb. The results may be only slightly different in the two instances, and insufficiently different to permit ready distinguishing by usual techniques. In one instance, there may be a 7 megahertz disparity between the two situations, when dealing with a range of frequencies from zero up to about 2 gigahertz.

The present invention is specifically directed toward providing a simple and convenient way of resolving that difficulty, and thereby providing an enhancement of the accuracy of the frequency determination in such situations.

The present invention will be more readily perceived from the following description, taken in conjunction with the appended drawings in which, FIG. 1 is a schematic block diagram of a circuit according to the present invention, illustrated as applied to a triple conversion superheterodyne spectrum analyzer.

Figure 1:
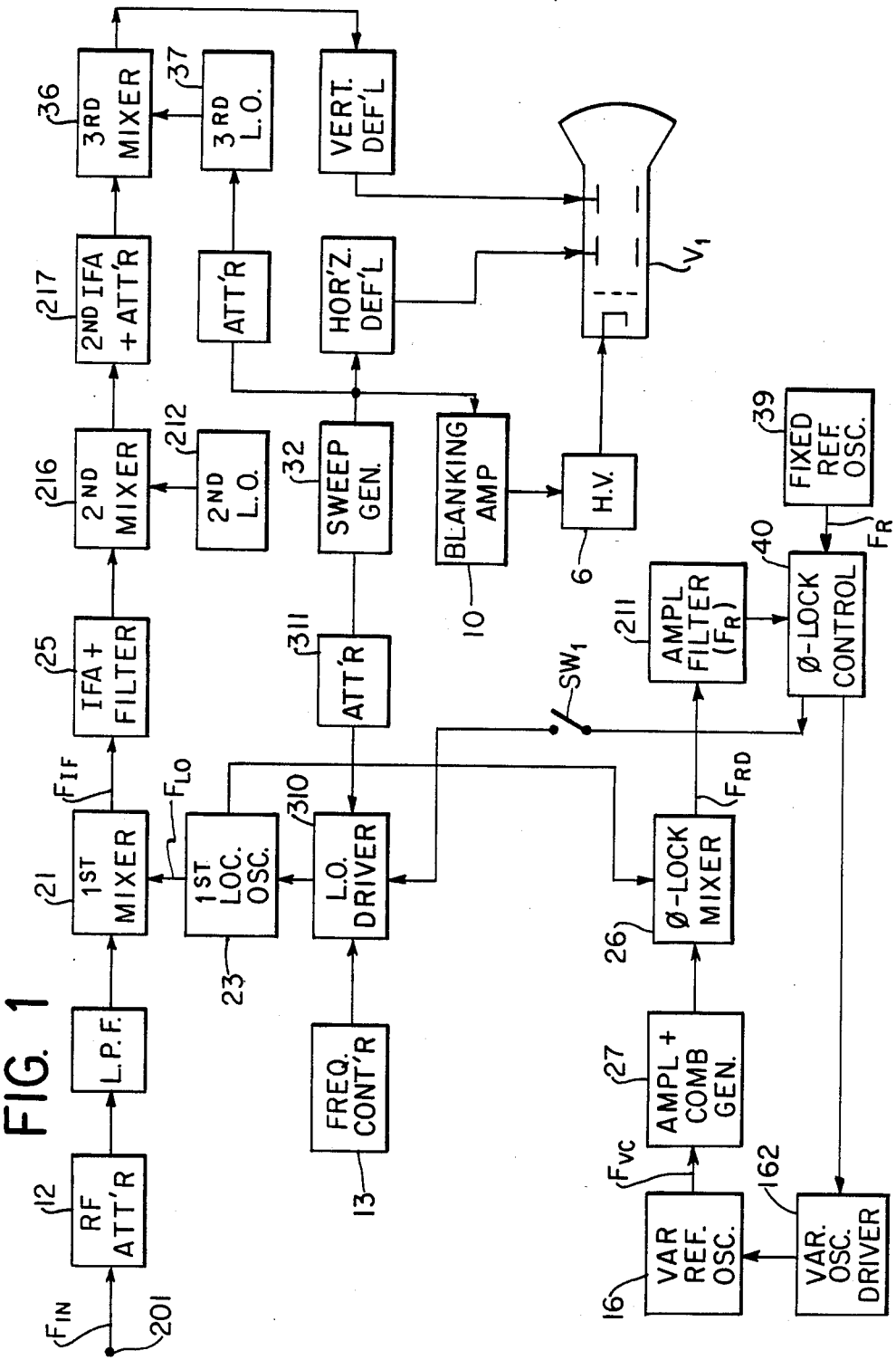

Referring to the drawings,

FIG. 1 shows a block diagram of a wide-band triple-conversion superheterodyne spectrum analyzer that automatically sweeps across a wide frequency band, such as from 10 kiloherz ("Khz") to 2 gigaherz ("Ghz"), to analyze an input signal in that range.

The spectrum analyzer is particularly useful in determining the frequency value $F_{IN}$ of an unknown received input signal. Frequency dispersion is accomplished by sweeping a first local oscillator over a desired range, such as 2 to 4.0 Ghz, and heterodyning its output with the input signal. By way of illustration, the first intermediate frequency ("IF") may be 2.06 Ghz, the second IF at 65 megaherz ("Mhz") and the third IF at 10.7 Mhz. The third IF circuit may have both a variable bandwidth amplifier for resolving closely-spaced input signals, and an amplifier that provides either logarithmic ("LOG") or linear ("LIN") gain. The LOG/LIN amplifier output amplitude is peak-detected and is fed to a display section (via a vertical deflection amplitude) where the signal appears as a frequency-versus-amplitude display. The display device may be a cathode ray tube ("CRT") whose horizontal deflection is synchronized with the local oscillator sweep so that the vertical deflection determined by the LOG/LIN peak detector is automatically positioned along the frequency-calibrated horizontal axis. One form of such a spectrum analyzer is Polarad Model 632C-1, produced by Rohde & Schwarz-Polarad, Inc., Lake Success, N.Y.

Referring to FIG. 1, the unknown input radio frequency signal ("RF") of from 10 Khz to about 2 Ghz may be applied to terminal 201. The RF input signal of frequency $F_{IN}$ is attenuated by a step attenuator 12 to prevent overloading of a doubly balanced first mixer circuit 21 in which the input signal is heterodyned with the output of the first local oscillator ("LO") 23. The input signal is thus up-converted to the first IF (e.g. 2.06 Ghz), which eliminates spurious responses that would occur by using a low IF. Use of fundamental-frequency balanced mixing minimizes harmonic responses, and image and multiple responses may be eliminated by use of an IF amplifier 25 with an optional low-pass filter (e.g. of 1.8 Ghz).

The first LO 23 is a suitable tunable oscillator, such as a solid-state YIG-tuned oscillator, with its frequency $F_{LO}$ tunable illustratively from 2.06 to 4.1 Ghz. For wide frequency spans (e.g. 0.5 Mhz per division or above) the first LO 23 is tuned to sweep about a selectable center frequency $F_o$ set by a suitable frequency selector switch or control 13 supplying a center-frequency control voltage. A sweep generator 32 provides a signal for sweeping the first LO 23 output $F_{LO}$ as described below, by supplying a voltage ramp which is summed with the center frequency control voltage in a local oscillator driver circuit 310. The frequency dispersion or sweep range is determined by a suitable attenuator 311 in the output of the sweep generator 32, which adjusts the amplitude of the tuning voltage ramp. To cover an entire 0 to 1.8 Ghz RF input range, the LO 23 would sweep from 2.06 to 3.86 Ghz.

The sweep generator 32 thus supplies a tuning voltage ramp (such as ±5 volts in amplitude) which is applied to the first LO driver circuit 310 to sweep the output of the first LO 23. The same ramp voltage drives the horizontal deflection circuits in a CRT or similar display V1, to provide the frequency-calibrated horizontal display. The sweep generator 32 also controls a blanking amplifier 10 to provide a blanking pulse which shuts off the high-voltage source 6 for the display V1, during beam retrace.

The first IF output $F_{IF}$ from first mixer 21 after being amplified and filtered by first IF amplifier/filter 25 is supplied to a second mixer 216 where it is mixed with the fixed-frequency output of a second LO 212, illustratively of 1.995 Ghz. The difference frequency of 65 Mhz is the second IF, which is fed to the second IF amplifier/attenuator 217, and thence to the third mixer 36. The amount of attenuation introduced may be set by a reference level control, not shown. At the third mixer 36, the second IF signal is mixed with the output of a third LO 37 to be down-converted to the third IF, illustratively of 10.7 Mhz. The third LO 37 is preferably a stable voltage-controlled oscillator tunable over a small range, such as from 53.8 to 54.8 Mhz. For wide frequency spans (e.g. 0.5 Mhz per division or higher) the third LO frequency is fixed. For narrow frequency spans (e.g. 100 Khz per division or less) the third LO is swept under control of the sweep generator 32, in suitable manner. For fixed-frequency or zero span, the sweep generator is disconnected from both the first LO 23 and the third LO 37.

Figure 2:
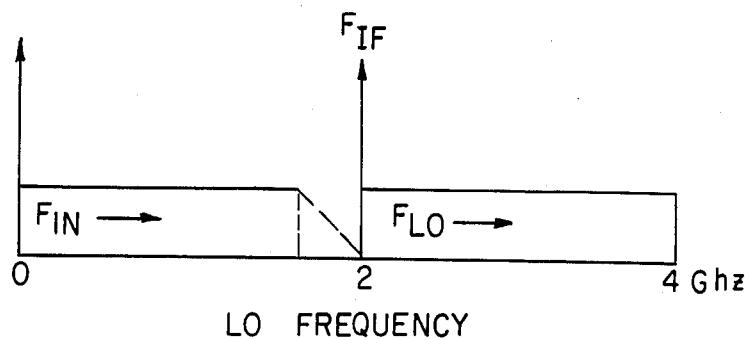
FIG. 2 is a graph showing relative frequencies in the system of the present invention.
Figure 4:
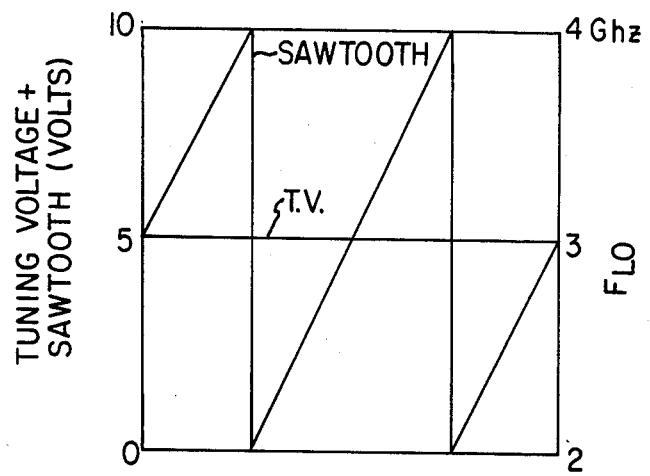
FIG. 4 is a graph of tuning voltage versus frequency, useful in explaining the present invention.

FIG. 2 illustrates the frequency conversion of the input signal $F_{IN}$ at the first mixer to produce the first $IF(F_{IF})$. FIG. 4 illustrates the tuning voltage T.V. (and hence the first LO frequency $F_{LO}$ to which it is proportional) as a function of time illustrated as a sawtooth wave of amplitude 10 volts, centered at a 5-volt value. The zero value corresponds to 2 Ghz and the 10-volt value to 4 Ghz for the local oscillator, corresponding similarly to input frequencies of 0 to 2 Ghz. This shows how the input frequency to which the system is tuned will be swept.

Figure 3:
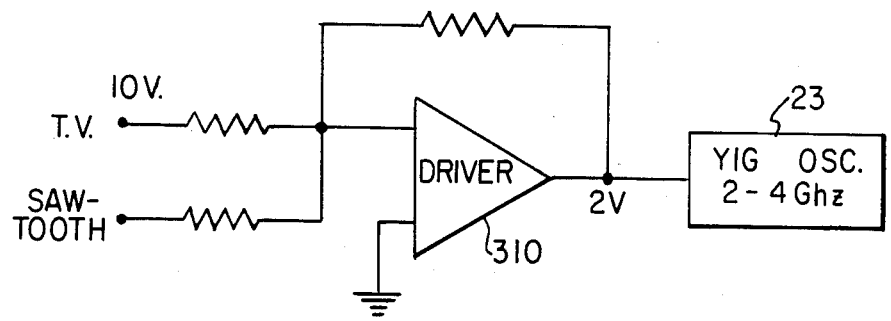
FIG. 3 is a fragmentary circuit diagram of a portion of FIG. 1.

As shown in FIG. 3, the tuning voltage T.V. from center frequency control circuit 13 is added to the sawtooth sweep voltage from sweep generator 32 in driver circuit 310, and the sum controls the first LO 23 to vary its frequency over a range illustratively from about 2 to 4 Ghz, by repetitive sweeping as shown in FIG. 4. As appears from FIG. 2, the input signal $F_{IN}$ is equal to the LO frequency $F_{LO}$ less the first IF value $F_{IF}$. Hence, by making the IF constant (say 2.06 Ghz) the input frequency $F_{IN}$ can be determined accurately by measuring the first LO frequency $F_{LO}$ precisely. The principal object of the present invention is to enhance the precision of acquiring the input frequency by determining the LO frequency $F_{LO}$.

For narrow and zero frequency spans, the display resolution is limited by the frequency stability of the first LO 23, which is therefore held and required to be at a fixed frequency $F_{LO}$ in those situations, as by an automatic phase-lock stabilization circuit shown in FIG. 1 formed by a phase-lock mixer 26, phase-locked to a harmonic of a stable but variable crystal-controlled reference oscillator 16 of frequency $F_{VC}$ (illustratively of 17 Mhz output). Although crystal-controlled, the frequency $F_{VC}$ of reference oscillator 16 may be varied or "pulled" slightly (e.g. up to 85 Khz) from its nominal crystal-controlled frequency (e.g. 17 Mhz.). In this situation, the only inputs to the driver circuit 310 are the set center frequency tuning voltage T.V. and a phase-lock stabilization error voltage on line 51. However, for wide frequency spans, this phase-lock circuit 26 is made inoperative, as by opening line 51.

Figure 5:
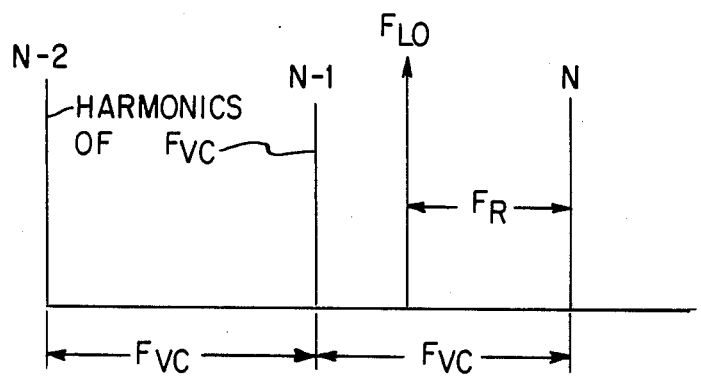
FIG. 5 is frequency diagram showing the relationship between the local oscillator frequency and comb frequencies.

For narrow-span operation, the phase-lock circuit operates by heterodyning in phase lock mixer 26 the first LO frequency $F_{LO}$ from first LO 23 with one of the harmonics from variable reference oscillator 16 produced in an amplifier "comb generator" circuit 27. Circuit 27 produces a richly harmonic output, with a large number of multiples of the variable reference frequency (e.g., N times 17 Mhz) which is called a frequency comb, formed as a series of separate frequencies spaced by $F_{VC}$. The output of the phase lock mixer 26 is passed through a fixed-tuned amplifier and filter 21 tuned to a fixed frequency $F_R$ (e.g., 12 Mhz) and is phase-compared to the output of a fixed reference oscillator 39 in a phase-lock control circuit 40. The output of circuit 40 slupplies a driver 162 which causes the variable reference oscillator frequency $F_{VC}$ to be varied ("pulled") until a zero error voltage is sensed in circuit 40 whereupon its frequency is locked, indicating that the first LO frequency (e.g. 2.06 Ghz) differs by a fixed amount $F_R$ (e.g. 12 Mhz) from some unknown multiple N of the first reference frequency $F_{VC}$ (e.g. N times 17 Mhz). If the first LO frequency shifts, (due to drift of LO 23) the phase control circuit 26 feeds an appropriate error voltage to driver 310 by way of phase lock control 40 to correct the drift until the difference between the first local oscillator frequency ($F_{LO}$) and the comb frequency $N \times F_{VC}$ (e.g. $N \times 17$ Mhz) is again exactly the reference frequency $F_R$ from oscillator 39 (e.g. 12 Mhz). This frequency relation is illustrated in FIG. 5, showing the comb harmonics N, N−1 and N−2 in relation to $F_{LO}$ in the illustrative example used. In this case, the $F_{LO}$ is shown locked to harmonic N of the 17 Mhz variable-frequency reference, from which $F_{LO}$ differs by being exactly 12 Mhz below $N \times 17$ Mhz.

As will be seen from FIG. 5, the actual local oscillator frequency $F_{LO}$ may be determined by knowing which harmonic N is the one to which the LO 23 is locked. Thus, from FIG. 4

$$F_{LO} = F_{IF} + \frac{T.V.}{K} \qquad (1)$$

since the deviation of $F_{LO}$ from $F_{IF}$ is proportional to the tuning voltage T.V. with a proportionality factor (10 volt to 2 volt DVM system) of 1/K (e.g. 1/5 in this instance).

Then as seen in FIG. 5, the harmonic number N is $$N = \frac{(F_{LO} + F_R)}{F_{VC}} \qquad (2)$$

where $F_{VC}$ is the pulled frequency of the variable reference oscillator 16 and $F_R$ is the fixed reference frequency of reference oscillator 39. From this, $$F_{LO} = N \times F_{VC} - F_R \qquad (3)$$

The value of $F_{VC}$ can then be accurately determined by a frequency counter 403. Then $$F_{IN} = F_{LO} - F_{IF} \text{ if in Ghz} \quad (4)$$

$$= 1000 \, (F_{LO} - F_{IF}) \text{ in Mhz.} \quad (5)$$

Figure 6:
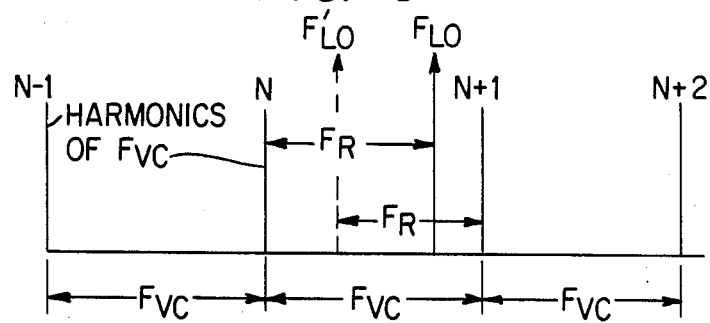
FIG. 6 is another diagram similar to FIG. 5, useful in explaining the present invention.

However, an error may arise if the LO frequency $F_{LO}$ locks (with a difference equal to the reference oscillator 39 frequency $F_R$) onto a lower harmonic of $F_{VC}$ as seen from FIG. 6. The proper value may be either $F_{LO}$ or $F'_{LO}$ in FIG. 6 differing by $F_{VC}-F_R$. According to an aspect of the invention, this ambiguity is avoided.

Figure 8:
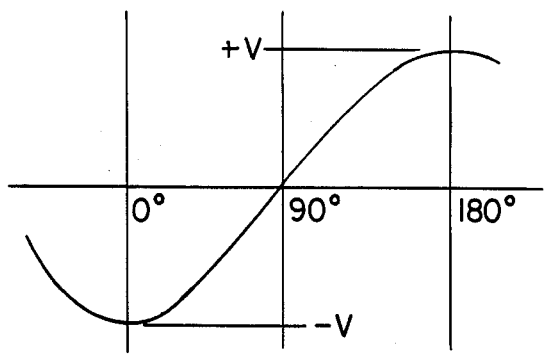
FIG. 8 is a graph of phase versus frequency for a phase detector used in the present invention.

As seen in FIG. 1, the phase lock mixer 26 combines the output frequencies $N \times F_{VC}$ of the comb generator 127 with the frequency $F_{LO}$ of the first local oscillator 23 to produce the reference difference frequently $F_{RD}$. This is compared with the fixed reference frequency $F_R$ in phase detector 40. When the difference between $F_R$ and $F_{RD}$ is zero, in frequency and phase, $F_{LO}$ is locked and equal to $N \times F_{VC} \pm F_R$. The reference difference frequency $F_{RD}$ is also compared with a 90-degree phase-shifted version of $F_R$ in detector 312. Each phase detector is of conventional type, producing an output characteristic as shown in FIG. 8, being positive for phase differences of 90°–180° and negative for differences of 0°–90°.

When LO frequency $F_{LO}$ is locked at $N \times F_{VC} - F_{LO}$, the output of detector 312 will be positive, and for $N \times F_{VC}$ less than $F_{LO}$ the output will be negative. This feature is utilized to resolve the ambiguity between N and N+1 shown in FIG. 6.

Figure 7:
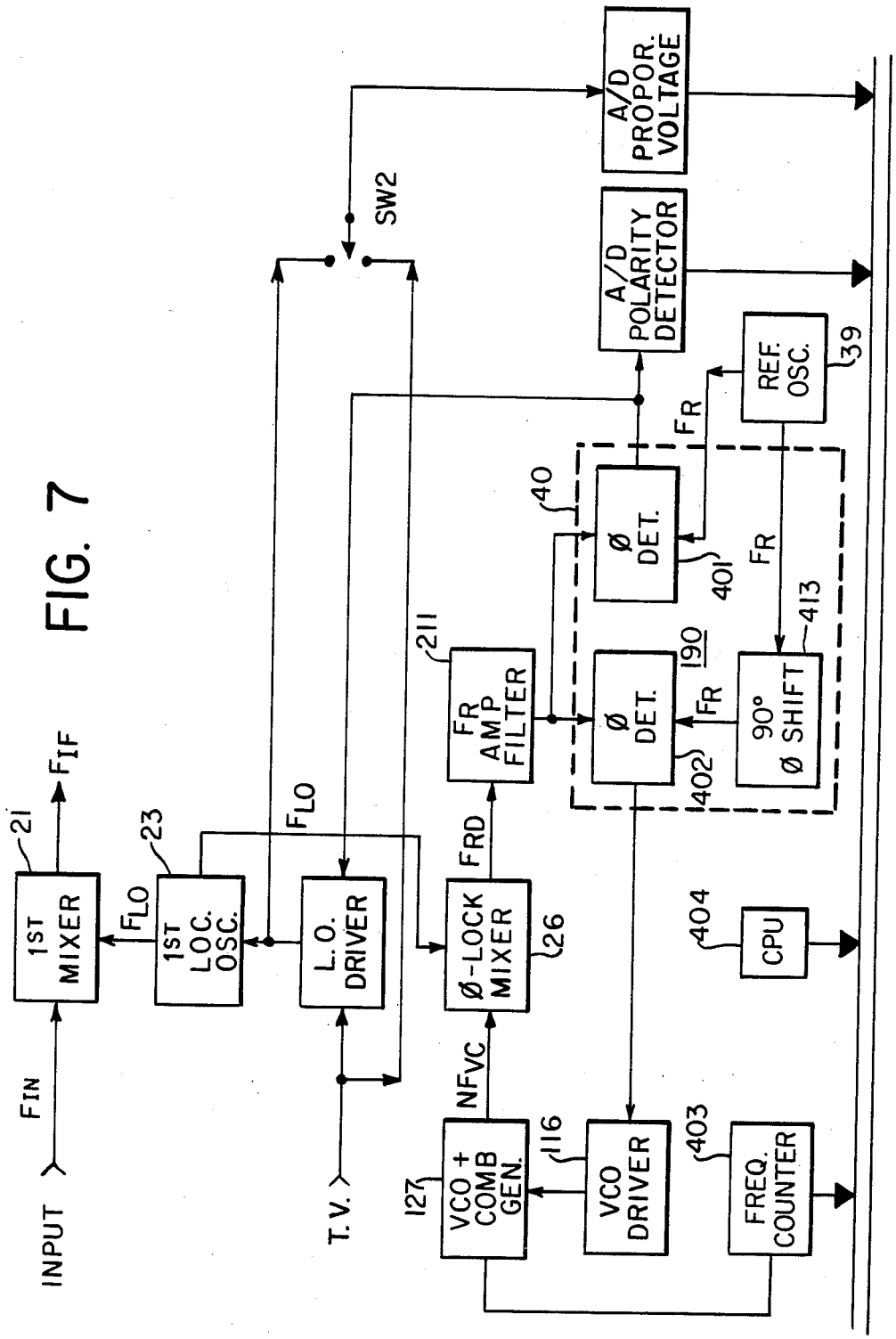
FIG. 7 is a block diagram showing a portion of the circuit of FIG. 1 according to the present invention.

As seen in FIG. 7, a conventional polarity detector 401, with signal conversion from analog to digital form, is fed from the output of phase detector 40. In usual manner, this produces a "high" digital signal (e.g., bit "1") for a positive input signal, and a "low" digital signal (e.g. bit "0") for a negative input signal.

Another conventional analog/digital converter 402 produces in known manner a digital signal representing the tuning voltage applied to first LO 23, which is therefore representative of tuning voltage T.V. in equation (1) above. This A/D converter 402 may alternatively be supplied from the T.V. input to LO driver 310, as symbolically represented by switch SW2. A conventional counter circuit 403 determines the actual frequency $F_{VC}$ of the variable crystal oscillator 16, in digital form.

The digital outputs of circuits 401, 402 and 403 are combined in a suitable microprocessor or CPU 404 (or equivalent electronic circuitry performing the same functions) to calculate the equations above, with the difference that, if $F_{LO}$ is above $N \times F_{VC}$, as shown in FIG. 6, then the output from the polarity detector causes the sign of $F_R$ in equations 2 and 3 to be reversed, so that they become:

$$N = \frac{(F_{LO} - F_R)}{F_{VC}} \quad (2')$$

and $$F_{LO} = N \times F_{VC} + F_R \quad (3)$$

In this way, the possible error or uncertainty in the value of $F_{LO}$, leading to error in determining $F_{IN}$, is avoided and the ambiguity of the system is resolved.

While the foregoing description illustrates the present invention as applied to spectrum analyzers, it is to be understood that it is not limited thereto, but may be used in other situations where elimination of ambiguities is desired in heterodyne systems.

What is claimed is:

1. In a superheterodyne spectrum analyzer for determining the frequency $F_{IN}$ of a variable-frequency input signal and having a variable-frequency local oscillator producing a frequency $F_{LO}$ and a mixer for mixing said local oscillator frequency $F_{LO}$ and said input frequency $F_{IN}$ to produce an intermediate frequency $F_{IF}$ which is the difference between $F_{LO}$ and $F_{IN}$, apparatus for enhancing the accuracy of determination of $F_{IN}$ comprising:

(a) a source of a first reference frequency $F_{VC}$,
   (b) means for producing a frequency comb having numerous harmonics of said first reference frequency $F_{VC}$,
   (c) a source of a second reference frequency $F_R$,
   (d) means for causing said frequency $F_{LO}$ to differ from some multiple N of said first reference frequency $F_{VC}$ by said second reference frequency $F_R$ when said intermediate frequency $F_{IF}$ has a predetermined value,
   (e) means for determining the value of said multiple N regardless of whether said local oscillator frequency $F_{LO}$ is greater than or less than said reference frequency multiple $N \times F_{VC}$,
   (f) means for determining the value of $F_{LO}$ in response to said multiple-value-determining means and said sources of frequencies $F_{VC}$ and $F_{Lo}$, whereby the input frequency $F_{IN}$ is determined as the difference between the value of $F_{LO}$ and said predetermined value of $F_{IF}$.

2. Apparatus as in claim 1 further including
   (a) means determining whether said local oscillator frequency $F_{LO}$ is greater or less than said first reference frequency multiple $N \times F_{VC}$, and
   (b) means responsive to said preceding means for determining the value of said multiple N.

3. Apparatus as in claim 2 including
   means for determining said multiple N as the ratio of $F_{LO}$ plus $F_R$ to $F_{VC}$ when said multiple frequency $N \times F_{VC}$ is greater than $F_{LO}$ or as the ratio of $F_{LO}$ minus $F_R$ to $F_{VC}$ when said multiple frequency $N \times F_{VC}$ is less than $F_{LO}$.

4. Apparatus as in claim 1 further including
   means for varying the frequency of said first reference frequency $F_{VC}$ to cause said multiple N of said first reference frequency to differ from said local oscillator frequency $F_{LO}$ by an amount equal to said second reference frequency $F_R$.

5. Apparatus as in claim 4 further including means deriving a signal of a frequency equal to the difference between said local oscillator frequency $F_{LO}$ and said multiple frequency $N \times F_{VC}$,
   means responsive to said difference frequency for determining whether said multiple frequency $N \times F_{VC}$ is greater or less than said local oscillator frequency.

6. Apparatus as in claim 5 wherein a last means comprises means for phase-shifting the output of said second reference frequency source by 90 degrees, and
   a phase-lock detector responsive to said phase-shifted signal and to said difference-frequency signal for producing a polarity signal whose polarity indicates whether said local oscillator frequency $F_{LO}$ is greater or less than said multiple frequency $N \times F_{VC}$.

7. Apparatus as in claim 6 further including means determining said multiple in response to said polarity signal.

8. Apparatus as in claim 1 further including means determining said input frequency $F_{IN}$ as the difference between said intermediate frequency $F_{IF}$ and said multiple N times said first source frequency $F_{VC}$, which difference is increased or decreased by said second source frequency $F_R$ in accordance with the polarity of said polarity signal.

9. A system for determining the frequency $F_{IN}$ of a variable-frequency input signal, comprising
(i) a variable-frequency local oscillator producing a frequency $F_{LO}$,
(ii) a mixer for mixing said local oscillator frequency $F_{LO}$ and said input frequency $F_{IN}$ to produce an intermediate frequency $F_{IF}$,
(iii) means for adjusting the frequency $F_{LO}$ to cause said intermediate frequency $F_{IF}$ to have a predetermined fixed value and
(iv) means for determining the frequency of said local oscillator, said last means comprising
 (a) a source of a first adjustable reference frequency $F_{VC}$,
 (b) means for producing a frequency comb having numerous harmonics of said first reference frequency $F_{VC}$,
 (c) a source of a second fixed reference frequency $F_R$,
 (d) means for varying said first reference frequency $F_{VC}$ to cause some multiple N of said first reference frequency $F_{VC}$ to differ from said local oscillator frequency $F_{LO}$ by an amount equal to said second reference frequency $F_R$,
 (e) means for determining the value of said multiple N regardless of whether said local oscillator frequency $F_{LO}$ is greater than or less than said reference frequency multiple $N \times F_{VC}$, and
 (f) means for determining the value of $F_{LO}$ in response to said multiple-value-determining means and said sources of frequencies $F_{VC}$ and $F_{LO}$,
whereby the input frequency $F_{IN}$ is determined as the difference between the thus determined value of $F_{LO}$ and said predetermined value of $F_{IF}$.

10. The method of determining the frequency of an unknown signal, comprising the steps of producing a first adjustable reference frequency, producing a frequency comb having numerous harmonics of such first reference frequency, producing a second fixed reference frequency, mixing said input signal and a signal of some multiple of said first reference frequency to produce a difference frequency, adjusting said first reference frequency to cause said difference frequency to equal said fixed second reference frequency, determining whether the value of said frequency multiple is greater than or less than the frequency of said unknown signal, determining the value of said multiple regardless of whether said input signal frequency is greater than or less than said multiple frequency, and determining said unknown signal frequency as the said determined multiple of said first reference frequency plus or minus said fixed reference frequency in correspondence with whether said unknown signal frequency is greater than or less than said multiple frequency.

11. A method as in claim 10, wherein said step of determining whether said unknown signal frequency is greater or less than said reference frequency multiple comprises the step of mixing said difference frequency with said second reference frequency in a phase-lock detector, and determining the polarity of the result.

12. A method as in claim 11 comprising the step of mixing a 90° phase-shifted version of said fixed reference frequency with said difference frequency and determining the polarity of the result.

* * * * *